United States Patent
Chen et al.

(10) Patent No.: US 10,120,468 B2
(45) Date of Patent: Nov. 6, 2018

(54) TOUCH DEVICE COMPRISING PRESSURE-SENSING LAYER AND FLAT TOUCH SENSING LAYER

(71) Applicant: TPK Touch Solutions (Xiamen) Inc., Xiamen (CN)

(72) Inventors: Wenlong Chen, Xiamen (CN); Cheng-Chung Chiang, Kaohsiung (TW); Yau-Chen Jiang, Zhubei (TW); Yanjun Xie, Wuhan (CN); Bin Lai, Fuzhou (CN); Ching-Shan Lin, Tainan (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 15/175,056

(22) Filed: Jun. 7, 2016

(65) Prior Publication Data
US 2016/0364070 A1 Dec. 15, 2016

(30) Foreign Application Priority Data

Jun. 10, 2015 (CN) .......................... 2015 1 0314479
Jul. 8, 2015 (CN) .......................... 2015 1 0397323

(51) Int. Cl.

| | |
|---|---|
| *G06F 3/041* | (2006.01) |
| *G02F 1/1333* | (2006.01) |
| *G02F 1/1335* | (2006.01) |
| *G02F 1/1343* | (2006.01) |
| *G02F 1/1362* | (2006.01) |

(Continued)

(52) U.S. Cl.
CPC ............ *G06F 3/041* (2013.01); *G02F 1/1368* (2013.01); *G02F 1/13338* (2013.01); *G02F 1/13439* (2013.01); *G02F 1/133345* (2013.01); *G02F 1/133514* (2013.01); *G02F 1/133528* (2013.01); *G02F 1/134309* (2013.01); *G02F 1/136286* (2013.01); *G06F 3/044* (2013.01); *G06F 3/0412* (2013.01); *G06F 3/0414* (2013.01); *G06F 3/0416* (2013.01); *H05K 1/0296* (2013.01); *G02F 2001/133357* (2013.01); *G02F 2202/28* (2013.01); *G06F 2203/04102* (2013.01); *G06F 2203/04104* (2013.01); *G06F 2203/04105* (2013.01); *G06F 2203/04106* (2013.01); *G06F 2203/04111* (2013.01)

(58) Field of Classification Search
CPC . G09F 2203/04103; G09F 2203/04105; G06F 3/03547; G06F 3/0414; G06F 1/13338
USPC .................................................. 345/173–178
See application file for complete search history.

(56) References Cited

U.S. PATENT DOCUMENTS

| | | | | |
|---|---|---|---|---|
| 2007/0291016 | A1* | 12/2007 | Philipp ................ | G01D 5/2405 345/174 |
| 2008/0100587 | A1* | 5/2008 | Sano ...................... | G06F 3/041 345/173 |

(Continued)

*Primary Examiner* — Roy P Rabindranath

(57) ABSTRACT

The disclosure provides a touch device, including a protection cover, a pressure-sensing layer and a flat touch-sensing electrode layer. The protection cover is used as an outer protection shield, and an upper surface of the protection cover is provided to users for pressing action. The pressure-sensing layer is disposed under the protection cover to detect touch strength. The flat touch-sensing electrode layer is disposed between the pressure-sensing layer and the protection cover to detect the position of the user's touch.

20 Claims, 8 Drawing Sheets

(51) Int. Cl.
  *G02F 1/1368* (2006.01)
  *G06F 3/044* (2006.01)
  *H05K 1/02* (2006.01)

(56) References Cited

U.S. PATENT DOCUMENTS

| | | | |
|---|---|---|---|
| 2010/0053095 A1* | 3/2010 | Wu | G06F 3/0488 345/173 |
| 2010/0128002 A1* | 5/2010 | Stacy | G06F 3/016 345/174 |
| 2013/0265256 A1* | 10/2013 | Nathan | G06F 3/0414 345/173 |
| 2015/0268766 A1* | 9/2015 | Kim | G06F 3/044 345/174 |
| 2016/0162093 A1* | 6/2016 | Kim | G06F 3/0412 345/174 |

* cited by examiner

TOUCH DEVICE COMPRISING PRESSURE-SENSING LAYER AND FLAT TOUCH SENSING LAYER

CROSS REFERENCE TO RELATED APPLICATIONS

This application claims priority of Chinese Patent Application No. 201510314479.0 & 201510397323.3, filed on Jun. 10, 2015 & Jul. 8, 2015, the entirety of which is incorporated by reference herein.

BACKGROUND OF THE DISCLOSURE

Technical Field

The application relates in general to a touch device, and in particular to a touch device having a three-dimensional touch detection.

Description of the Related Art

The touch device has become a common human-machine interface device. When the user looks at text or figures shown on the touch device behind the screen and touches a corresponding position, the touch device senses the touch signals and transmits the touch signal to the controller for generating the output signal that corresponds to the touched position. Common sensing methods include resistive sensing, capacitive sensing, infrared sensing and ultrasonic sensing. For example, the capacitive sensing system uses a capacitive sensor, as the capacitance value of the touched position changes when the user touches the touch device. Thus, the sensing system calculates the variations in the capacitance value and generates an output signal that corresponds to the touched position.

In recent years, a pressure-sensing device for detecting the pressure level has provided better experiences for users, and has become popular.

BRIEF SUMMARY OF DISCLOSURE

An object of the present disclosure is to provide a touch device having three-dimensional touch detection.

In some embodiments of the disclosure, a touch device includes: a protection cover, used as an outer protection shield, and an upper surface of the protection cover is provided to users for a pressing action; a pressure-sensing layer, disposed under the protection cover, configured to detect touch strength; and a flat touch-sensing electrode layer, disposed between the pressure-sensing layer and the protection cover, configured to detect a position of the pressing action.

And in some embodiments of the disclosure, a pressure-sensing layer includes at least one radial pressure-sensing electrode, the radial pressure-sensing electrode has a plurality of extension portions, and the extension portion is presented as a radial pattern outwards from the center of the radial pressure-sensing electrode for increasing a pressure-detection sensitivity.

DETAILED DESCRIPTION OF DISCLOSURE

The present disclosure provides a touch device, including a protection cover, a pressure-sensing layer, and a flat touch-sensing electrode layer disposed between the protection cover and the pressure-sensing layer. For detailed description of the present disclosure, please refer to the figures and the corresponding description.

Figure 1:
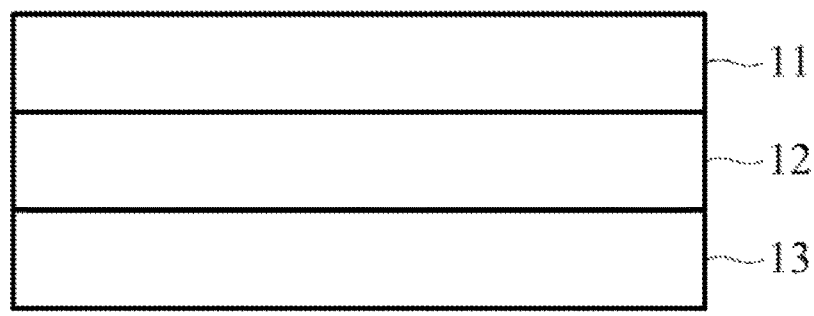
FIG. 1 is a schematic diagram of a touch device in accordance with one or more embodiments of the disclosure.

FIG. 1 is a schematic diagram of a touch device in accordance with one or more embodiments of the disclosure. A preferred material of the protection cover 11 is a strengthened hard sheet, such as hard plastic, tempered glass, or $Al_2O_3$. The protection cover 11 is used as an outer protection shield of the touch device, and the user can implement a pressing action on the upper surface of the protection cover 11. The pressure-sensing layer 13 is disposed under the protection cover 11, and is used to detect the pressing strength of the pressing action. The flat touch-sensing electrode layer 12 is disposed between the protection cover 11 and the pressure-sensing layer 13, and is used to detect a position of the pressing action. In some other embodiments, the touch device further includes an insulating flat layer (not shown) covering the bottom surface of the flat touch-sensing electrode layer 12. The pressure-sensing layer 13 is disposed on the bottom surface of the insulating flat layer. In some embodiments, the insulating flat layer can be used as a protective layer of the flat touch-sensing electrode layer 12, and used to planarize the pattern of the flat touch-sensing electrode layer 12 and provide a function of electrical insulation, for avoiding the pattern of the flat touch-sensing electrode layer 12 electrically effecting the electrical property of the patterns of the pressure-sensing layer 13. In some embodiments, the material of the insulating flat layer can be polyimide (PI).

The flat touch-sensing electrode layer 12 includes a plurality of first direction detection electrodes (not shown) and a plurality of second direction detection electrodes (not shown). A transparent insulating material is used to electrically separate the first direction detection electrodes and the second direction detection electrodes at an intersecting position of the first direction detection electrodes and the second direction detection electrodes, and the first direction detection electrodes and the second direction detection electrodes compose a flat sensing pattern. In some embodiments, the first direction detection electrodes and the second direction detection electrodes are disposed on the same surface of the same substrate, thus the flat touch-sensing electrode layer 12 can be a single indium tin oxide (SITO) structure.

When the user implements a pressing action on the top surface of the protection cover 11, the position of the pressing action might cause a variation of the capacitance value between the first direction detection electrodes and the second direction detection electrodes. Therefore, the position of the pressing action, can be inferred by detecting the variation of the capacitance value of the flat touch-sensing electrode layer 12.

The pressure-sensing layer 13 includes at least one pressure-sensing electrode (not shown). When the user implements a pressing action on the upper surface of the protection cover 11 which is facing away from the flat touch-sensing electrode layer 12, the strength of the pressing action might transmit to the pressure-sensing layer 13 through the protection cover 11 and the flat touch-sensing electrode layer 12, and cause a deformation of the pattern of the pressure-sensing electrode and further cause a variation of a resistance value of the pressure-sensing electrode. Different strengths of the pressing action might cause different levels of the deformation of the pattern of the pressure-sensing electrode, and further cause different variations of the resistance value of the pressure-sensing electrode. Thus, the strength of the pressing action, which is a variation of the pressing action in Z direction, can be inferred by detecting the variations of the resistance value of the pressure-sensing electrode of the pressure-sensing layer.

In some embodiments, the flat touch-sensing electrode layer 12 is disposed between the protection cover 11 and the pressure-sensing layer 13, which means the pressure-sensing layer 13 is located under the flat touch-sensing electrode layer 12 far away from the pressing action side (protection cover). Because the process of the pressing action must be contact followed by press, compared with the pressure-sensing layer 13, the flat touch-sensing electrode layer 12 is closer to the pressing action side. The plane position can be detected after implementing the pressing action, then the pressure-sensing layer 13 starts scanning after the pressing action is performed. Thus, the disposed portion of the pressure-sensing layer 13 and its detection will not affect the signal of the flat touch-sensing electrode layer 12. However, because there is at least one flat touch-sensing electrode layer 12 disposed between the pressure-sensing layer 13 and the pressing action side (protection cover), an attenuation of the pressure transmission must be considered, and the pressure sensitivity of the pressure-sensing layer 13 must be increased.

Figure 2A:
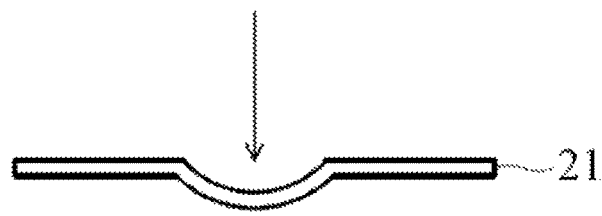
FIG. 2A is a sectional schematic diagram of a deformation of an object when a force acts on a surface of the object in accordance with some embodiments of the disclosure.
Figure 2B:
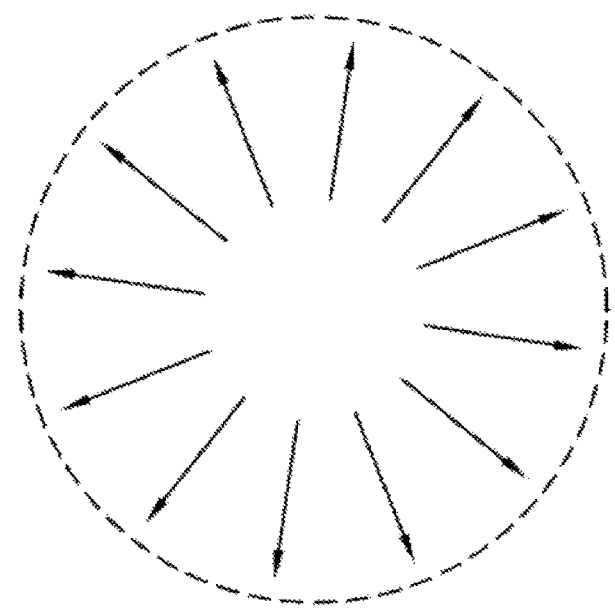
FIG. 2B is a schematic plan view of the deformation of the object when the force acts on the surface of the object in accordance with some embodiments of the disclosure.

FIGS. 2A and 2B are schematic diagrams showing the deformation of the object when a force acts on the object. FIG. 2A is a sectional schematic diagram of a deformation of an object when a force acts on a surface of the object in accordance with some embodiments of the disclosure. FIG. 2B is a schematic plan view of the deformation of the object when the force acts on the surface of the object in accordance with some embodiments of the disclosure. As shown in FIGS. 2A and 2B, the deformation is greatest at the center of the force, and then becomes smaller towards the periphery. As shown in FIG. 2B, the force with which the user presses on the surface of the object radiates from the center towards the periphery, and the strength is also gradually decreased from the center towards the periphery.

According to the description of FIGS. 2A and 2B, the electrode of the pressure-sensing layer 13 of the present disclosure has a special shape, which makes it so the deformation caused by the pressing action of the user on the pressure-sensing layer 13 can be effectively detected.

Figure 3A:
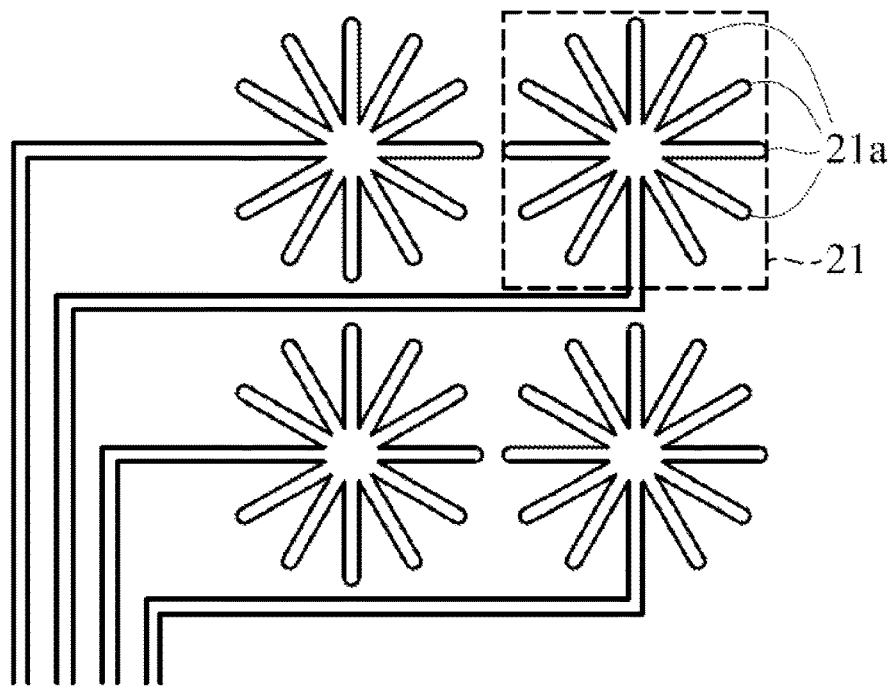
FIG. 3A is a schematic diagram of a pressure-sensing layer in accordance with some embodiments of the disclosure.

FIG. 3A is a schematic diagram of a pressure-sensing layer in accordance with some embodiments of the disclosure. The pressure-sensing layer 13 includes at least one radial pressure-sensing electrode 21. Each radial pressure-sensing electrode 21 is composed of a transparent wire bent and rounded in a radial pattern, which means the radial pressure-sensing electrode 21 is formed of a transparent wire extended along a radial direction from the center of the radial pressure-sensing electrode 21 for a certain length and wrapped back to the center of the radial pressure-sensing electrode 21 for forming an extension portion 21a. The extension portions 21a are disposed as a radial pattern from the center to the periphery of the radial pressure-sensing electrode 21.

To form a sensing electrode with a special shape, the present disclosure uses a transparent wire in which the resistance value will vary due to deformation, and makes it so that the variation of the resistance value caused by this deformation can be detected effectively. In some embodiments of the present disclosure, the range of the line width of the transparent wire is 3 um-500 um. The wire has the following characteristics: $GF=(\Delta R/R)/(\Delta L/L)$, wherein GF is a Gauge Factor, R is the initial resistance value of a sensing electrode, L is the total length of a wire of the sensing electrode, $\Delta R$ is variation of the resistance value of the sensing electrode, and $\Delta L$ is variation of the length of the wire of the sensing electrode.

When the Gauge Factor GF, the initial resistance R and the total length L of the wire are fixed, the length variation $\Delta L$ of the wire of the sensing electrode must be larger for effectively detecting the resistance variation $\Delta R$. In the radial pressure-sensing electrode 21 of the present disclosure, the density of the wires of the sensing electrodes in the center is greatest, and the wires are disposed as a radial pattern from the center to the periphery, which is the same as the transmission direction of the forces on the plane direction. The design as described above may let the sensing electrodes generate a large deformation $\Delta L$, which makes the corresponding resistance variation $\Delta R$ large enough for the detection, and furthermore, the depth can be determined according to the resistance variation. Briefly, the design of the radial pressure-sensing electrode 21 can effectively improve the pressure-detection sensitivity of the pressure-sensing layer 13. The more extension portions 21a there are in the same radial pressure-sensing electrode, and the greater the disposition of different radial pressure-sensing electrodes, the more sensitive the pressure sensing becomes when the user uses a finger or a stylus to touch the touch device.

In some embodiments, pressure sensing is executed by using the property of the resistance value to vary according to the length of the transparent wire. In some embodiments, the Gauge Factor GF must be larger than 0.5 to provide better sensing results.

The deformation varies according to the type and the strength of the force. For an object such as a stylus or finger, which is commonly used in touch devices and with a normal intensity of strength (0-10N), the deformation range that can be effectively detected by the pressure-sensing electrode is about 25 $mm^2$ to 225 $mm^2$. Thus, the size of at least one radial pressure-sensing electrode 21 is preferably about 25 $mm^2$ to 225 $mm^2$. In some preferred embodiments, the size of at least one radial pressure-sensing electrode 21 is about 100 mm$^2$, which is equal to the finger of an adult. A person skilled in the art can define a different sensing range according to the type and the strength of the force.

Figure 3B:
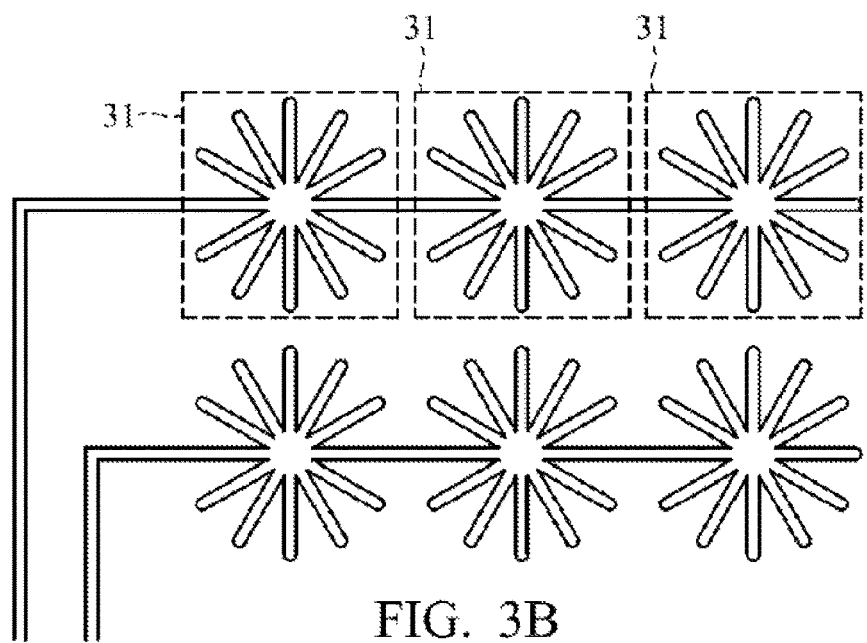
FIG. 3B are schematic diagrams of a pressure-sensing layer in accordance with some embodiments of the disclosure.
Figure 3C:
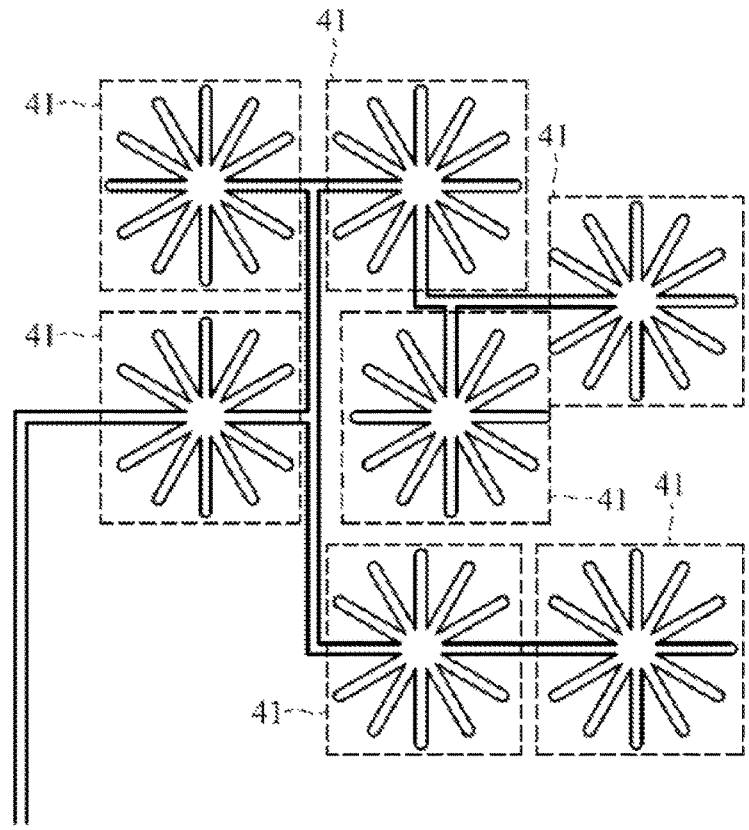
FIG. 3C are schematic diagrams of a pressure-sensing layer in accordance with some embodiments of the disclosure.

The pressure-sensing layer 13 shown in FIG. 3A includes at least one radial pressure-sensing electrode 21, and each radial pressure-sensing electrode 21 is formed of a single wire. FIGS. 3B and 3C are schematic diagrams of a pressure-sensing layer in accordance with some embodiments of the disclosure. As shown in FIG. 3B, the pressure-sensing layer 13 includes a plurality of radial pressure-sensing electrodes 31 formed of a transparent wire bent and rounded in a radial pattern, which means at least two radial patterns 31 are composed of a bent and rounded transparent wire. Compared with FIG. 3A, the number of detecting circuits which detect the resistance variation shown in FIG. 3B is greatly reduced, and the area of the layout of the detecting circuit and the control circuit corresponding to the touch device can also be reduced. As shown in FIG. 3C, the pressure-sensing layer 13 includes a plurality of radial pressure-sensing electrodes 41 formed of a transparent wire bent and rounded in a radial pattern, which means at least two radial patterns 41 are composed of a bent and rounded transparent wire. Compared with FIGS. 3A and 3B, the number of detecting circuits which detect the resistance variation shown in FIG. 3B is the minimum, and the area of the layout of the detecting circuit and the control circuit corresponding to the touch device can be greatly reduced.

It should be noted that even though the embodiments of the present disclosure describe the flat touch-sensing electrode layer 12 disposed between the protection cover 11 and the pressure-sensing layer 13, which means the pressure-sensing layer 13 is located under the flat touch-sensing electrode layer 12 far away from the pressing action side (protection cover), it is not limited thereto. It is clear that when using the radial pressure-sensing electrode as described above, the pressure-detection sensitivity can be improved, which means that the pressure-sensing layer having the radial pressure-sensing electrode can be separated from the flat touch-sensing electrode layer, and used to detect the pressure individually. Furthermore, when application of the pressure-sensing layer has no visual requirement, the wire is not limited to the transparent material.

Figure 4A:
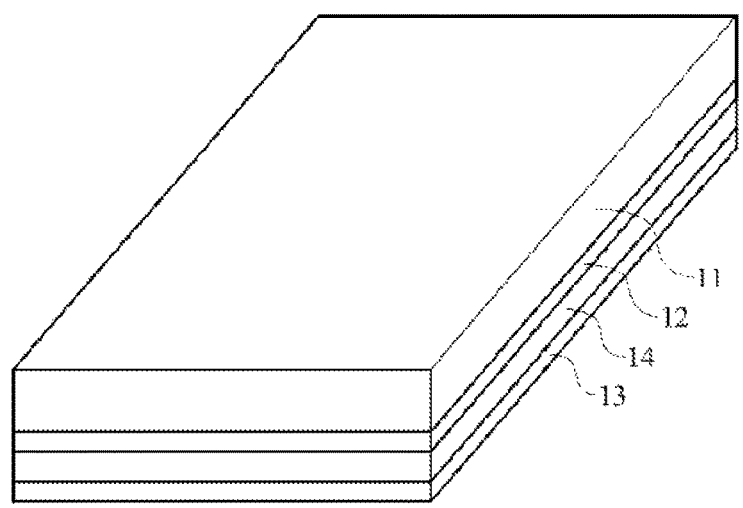
FIG. 4A is a schematic diagram of a touch device in accordance with some embodiments of the disclosure.
Figure 4B:
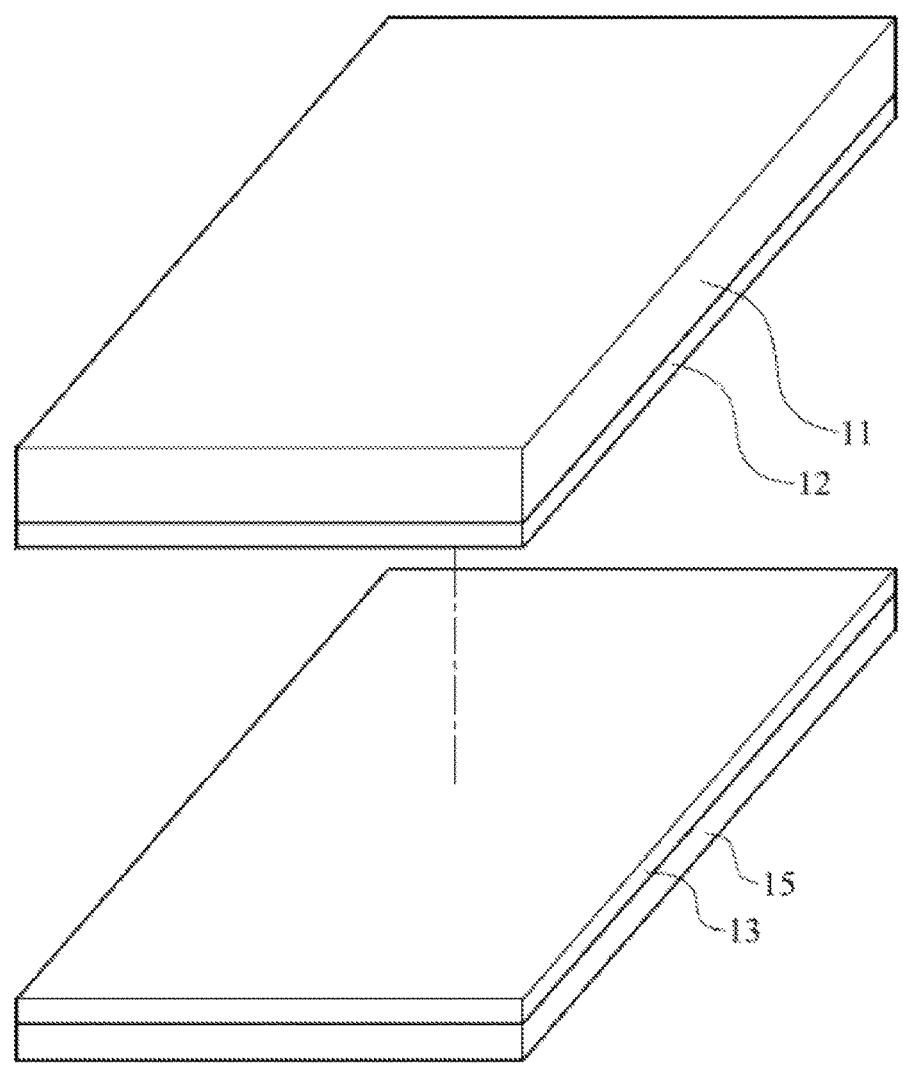
FIG. 4B is a schematic diagram of a touch device in accordance with some embodiments of the disclosure.
Figure 4C:
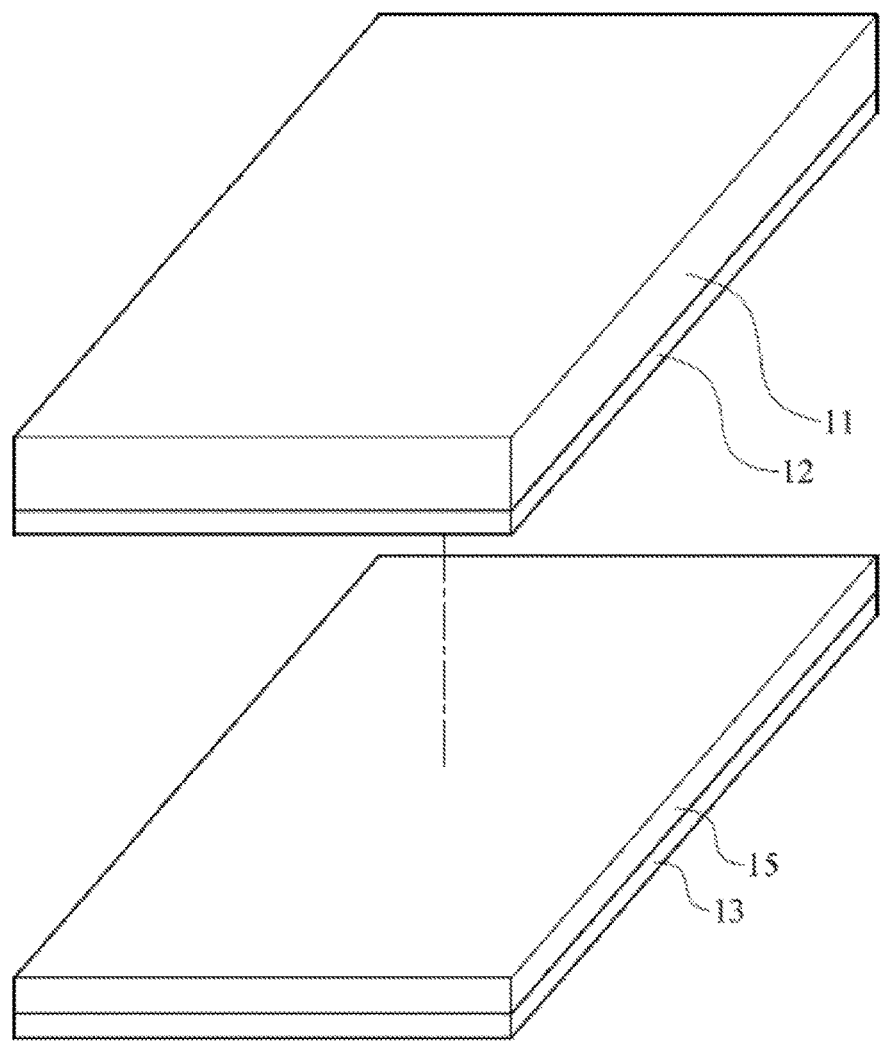
FIG. 4C is a schematic diagram of a touch device in accordance with some embodiments of the disclosure.

FIGS. 4A-4C are schematic diagrams showing the inside of the touch device in accordance with some embodiments of the disclosure. As shown in FIG. 4A, the touch device includes a protection cover 11, a flat touch-sensing electrode layer 12, a pressure-sensing layer 13, and an insulating flat layer 14. The flat touch-sensing electrode layer 12 is disposed directly on the bottom surface of the protection cover 11, the insulating flat layer 14 is covered on the bottom surface of the flat touch-sensing electrode layer 12, and the pressure-sensing layer 13 is disposed under the insulating flat layer 14. Because the flat touch-sensing electrode layer 12 and the pressure-sensing layer 13 are disposed under the protection cover 11, and the flat touch-sensing electrode layer 12 and the pressure-sensing layer 13 are only electrically separated by one insulating flat layer 14 without other substrates, thus the amount of substrate material used can be reduced.

The insulating flat layer 14 can be used to planarize the pattern of the flat touch-sensing electrode layer 12, and provide electrical insulation for preventing the flat touch-sensing electrode layer 12 from electrically connecting to the pressure-sensing layer 13. In some embodiments, the material of the insulating flat layer can be polyimide (PI).

As shown in FIG. 4B, the touch device includes a protection cover 11, a flat touch-sensing electrode layer 12, a pressure-sensing layer 13, and a transparent substrate 15. The flat touch-sensing electrode layer 12 is disposed directly on the bottom surface of the protection cover 11. The pressure-sensing layer 13 is disposed directly on the transparent substrate 15. The flat touch-sensing electrode layer 12 is bonded with the pressure-sensing layer 13 by optical clear adhesive. The material of the transparent substrate 15 can be hard plastic, tempered glass, or $Al_2O_3$. In some other embodiments, the transparent substrate 15 is a display panel. The display panel may include liquid crystal, organic light-emitting diode (OLED) or plasma.

As shown in FIG. 4C, the touch device includes a protection cover 11, a flat touch-sensing electrode layer 12, a pressure-sensing layer 13, and a transparent substrate 15. The flat touch-sensing electrode layer 12 is disposed directly on the bottom surface of the protection cover 11. The pressure-sensing layer 13 is disposed directly under the transparent substrate 15. In some embodiments, the flat touch-sensing electrode layer 12 is bonded with the transparent substrate 15 by optical clear adhesive.

Figure 5A:
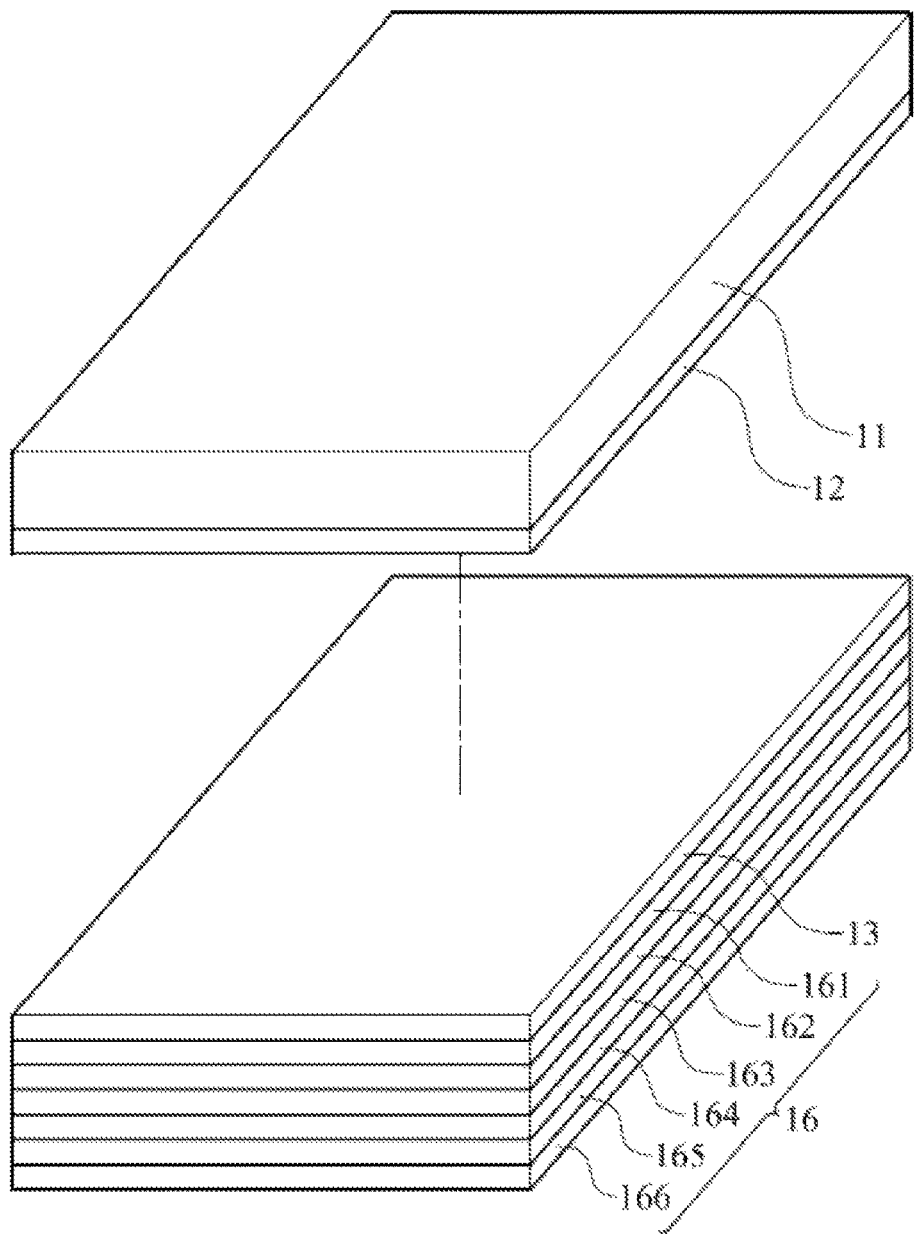
FIG. 5A a schematic diagram of a touch device in accordance with some embodiments of the disclosure.
Figure 5B:
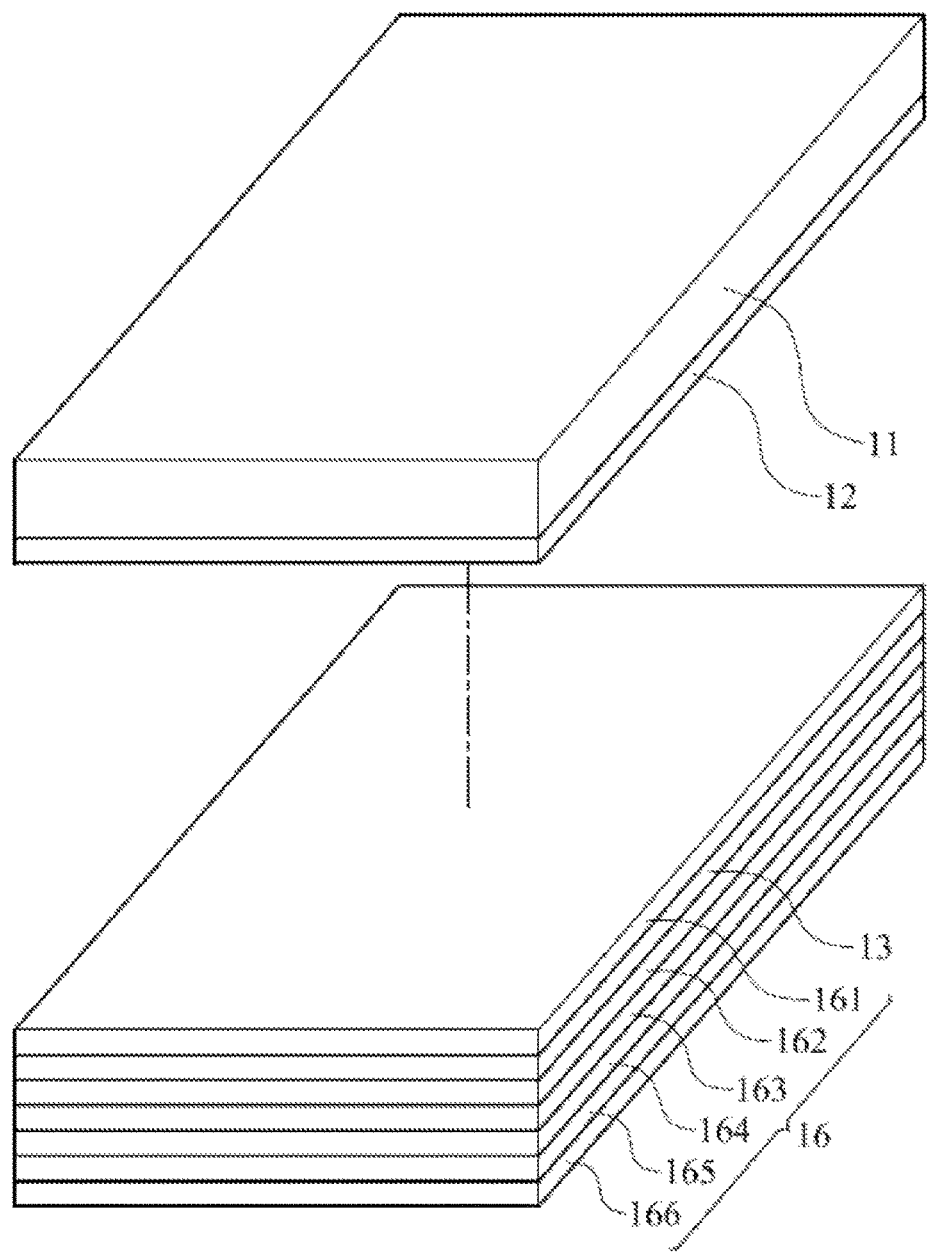
FIG. 5B a schematic diagram of a touch device in accordance with some embodiments of the disclosure.
Figure 5C:
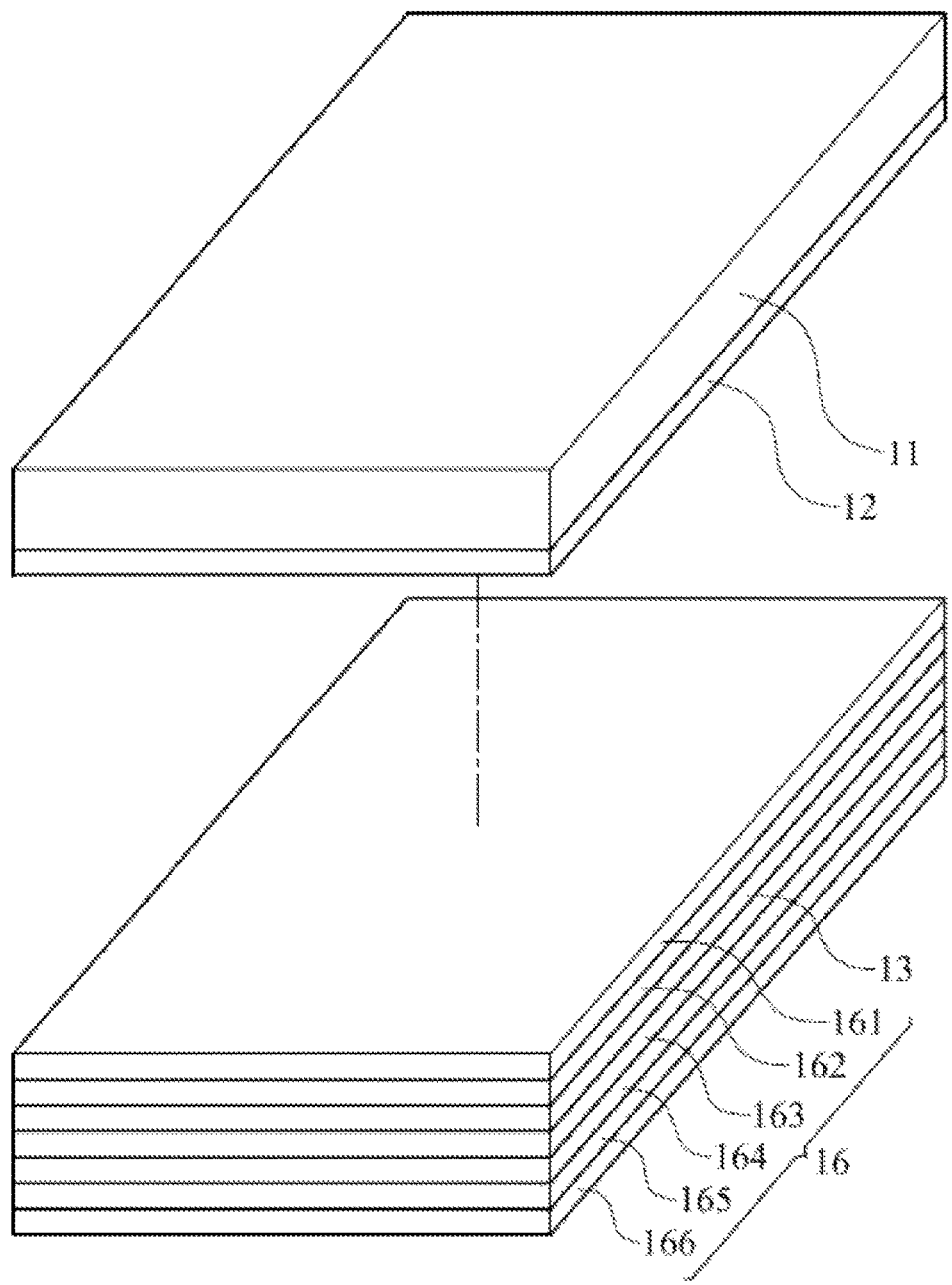
FIG. 5C a schematic diagram of a touch device in accordance with some embodiments of the disclosure.

FIGS. 5A-5C are schematic diagrams showing the inside of the touch device in accordance with some embodiments of the disclosure. As shown in FIG. 5A, the touch device includes a protection cover 11, a flat touch-sensing electrode layer 12, a pressure-sensing layer 13, and a display panel 16, wherein the pressure-sensing layer 13 is integrated into the display panel 16. In some embodiments, the flat touch-sensing electrode layer 12 is disposed directly on the bottom surface of the protection cover 11. The flat touch-sensing electrode layer 12 is bonded with the display panel 16 by optical clear adhesive. The type of the display panel 16 is not limited in the present disclosure, and may include liquid crystal, OLED or plasma.

For convenience of description, the LCD panel is used as an example hereinafter. As shown in FIG. 5A, the display panel 16 includes a top polarizer 161, a top substrate 162, a color filter set 163, a liquid-crystal layer 164, a drive layer 165 and a bottom substrate 166. The top polarizer 161 is disposed on the top substrate 162, the color filter set 163 is disposed under the top substrate 162, and the color filter set 163 includes a plurality of color filters. The drive layer 165 is disposed on the bottom substrate 166. The drive layer 165 includes a plurality of thin-film transistors (TFT). The liquid-crystal layer 164 is disposed between the color filter set 163 and the drive layer 165.

The pressure-sensing layer 13 shown in FIG. 5A is disposed directly on the bottom surface of the top polarizer 161. The flat touch-sensing electrode layer 12 is laminated with the pressure-sensing layer 13 by the optical clear adhesive.

The structure shown in FIG. 5B is almost the same as the structure shown in FIG. 5A, the difference being that the pressure-sensing layer 13 is disposed between the top polarizer 161 and the top substrate 162.

FIG. 5C is similar to FIG. 5A. The difference is that the pressure-sensing layer 13 is disposed between the top substrate 162 and the color filter set 163. In some other embodiments, the pressure-sensing layer 13 can be disposed between the color filter set 163 and the liquid-crystal layer 164, or between the liquid-crystal layer 164 and drive layer 165, or between the drive layer 165 and the bottom substrate 166, or on the bottom surface of the bottom substrate 166.

As described above, because the pressure sensing layer is far away from the user's operation side, the pressure-sensing layer might be insensitive when detecting the pressure variation generated from the touch of the user. For improving the sensitivity of the pressure sensing layer, the present disclosure provides a plurality of embodiments which describe the pressure-sensing layer having the radial pressure-sensing electrode pattern. The pressure sensing layer shown in FIGS. 3A-3C can be applied to the touch device shown in FIGS. 4A-4C and FIGS. 5A-5C.

Provided that those described above, only the preferred embodiments of the present disclosure, while not limiting the scope of the present disclosure. i.e., almost all made under this patent disclosure and the scope of the patent specification the content of simple equivalent change and modification, are still within the scope of the present disclosure covered by the patent. In addition, the scope of any embodiments or claim of the present disclosure does not have to achieve all objects or advantages or features of the present disclosure. In addition, the title and summary section is only used to assist patent document search and is not intended to limit the scope of the claimed disclosure.

What is claimed is:

1. A touch device, comprising:
a protection cover used as an outer protection shield, wherein an upper surface of the protection cover is provided to users for a pressing action;
a pressure-sensing layer, disposed under the protection cover, configured to detect touch strength;
a flat touch-sensing electrode layer, disposed between the pressure-sensing layer and the protection cover, configured to detect a position of the pressing action, wherein the flat touch-sensing electrode layer is disposed directly on a bottom surface of the protection cover; and
a display panel, wherein:
the display panel is composed at least by a polarizer, an upper substrate, a color filter set, a liquid-crystal layer, a driver layer and a bottom substrate from top to bottom, and
the pressure-sensing layer is embedded in the display panel between the polarizer and the upper substrate.

2. The touch device as claimed in claim 1, wherein:
the pressure-sensing layer at least comprises a radial pressure-sensing electrode,
the radial pressure-sensing electrode has a plurality of extension portions, and
each of the plurality of extension portions is presented as a radial pattern outwards from a center of the radial pressure-sensing electrode for increasing a pressure-detection sensitivity.

3. The touch device as claimed in claim 2, wherein a size of the radial pressure-sensing electrode is about 25 mm$^2$ to 225 mm$^2$.

4. The touch device as claimed in claim 2, wherein the radial pressure-sensing electrode is a transparent wire bent and rounded in a radial pattern.

5. The touch device as claimed in claim 1, wherein:
the pressure-sensing layer comprises a plurality of radial pressure-sensing electrodes,
each of the plurality of radial pressure-sensing electrodes is formed of a plurality of radial patterns bent and rounded by at least one transparent wire, and
at least two of the plurality of radial patterns are formed of one bent and rounded transparent wire.

6. The touch device as claimed in claim 4, wherein a range of a linewidth of the transparent wire is 3 um-500 um.

7. The touch device as claimed in claim 4, wherein a gauge factor of the transparent wire is greater than 0.5.

8. A touch device, comprising:
a pressure-sensing layer configured to detect touch strength, wherein:
the pressure-sensing layer comprises at least one radial pressure-sensing electrode,
the radial pressure-sensing electrode has a plurality of extension portions, and
each of the plurality of extension portions is presented as a radial pattern outwards from a center of the radial pressure-sensing electrode; and
a display panel, wherein:
the display panel is composed at least by a polarizer, an upper substrate, a color filter set, a liquid-crystal layer, a driver layer and a bottom substrate from top to bottom, and
the pressure-sensing layer is embedded in the display panel between the polarizer and the upper substrate.

9. The touch device as claimed in claim 8, wherein the radial pressure-sensing electrode is a transparent wire bent and rounded in a radial pattern.

10. The touch device as claimed in claim 9, wherein a gauge factor of the transparent wire is greater than 0.5.

11. The touch device as claimed in claim 8, wherein:
the pressure-sensing layer comprises a plurality of radial pressure-sensing electrodes, and
each of the plurality of radial pressure-sensing electrodes is formed of a plurality of radial patterns bent and rounded by at least one transparent wire, and
at least two of the plurality of radial patterns are formed of one bent and rounded transparent wire.

12. The touch device as claimed in claim 8, comprising:
a protection cover; and
a flat touch-sensing electrode layer disposed between the pressure-sensing layer and the protection cover, wherein the flat touch-sensing electrode layer is disposed directly on a bottom surface of the protection cover.

13. The touch device as claimed in claim 12, wherein the flat touch-sensing electrode layer is configured to detect a position of a pressing action of a user.

14. A touch device, comprising:
a protection cover, used as an outer protection shield, an upper surface of the protection cover provided to users for a pressing action;
a pressure-sensing layer, disposed under the protection cover, configured to detect touch strength;
a flat touch-sensing electrode layer, disposed between the pressure-sensing layer and the protection cover, configured to detect position of the pressing action, wherein the flat touch-sensing electrode layer is disposed directly on a bottom surface of the protection cover; and
a display panel, wherein:
the display panel is composed at least by a polarizer, an upper substrate, a color filter set, a liquid-crystal layer, a driver layer and a bottom substrate from top to bottom, and
the pressure-sensing layer is embedded in the display panel between the upper substrate and color filter set.

15. The touch device as claimed in claim 14, wherein:
the pressure-sensing layer at least comprises a radial pressure-sensing electrode,
the radial pressure-sensing electrode has a plurality of extension portions, and
each of the plurality of extension portions is presented as a radial pattern outwards from a center of the radial pressure-sensing electrode for increasing a pressure-detection sensitivity.

16. The touch device as claimed in claim 15, wherein a size of the radial pressure-sensing electrode is about 25 mm$^2$ to 225 mm$^2$.

17. The touch device as claimed in claim 15, wherein the radial pressure-sensing electrode is a transparent wire bent and rounded in a radial pattern.

18. The touch device as claimed in claim 17, wherein a range of a linewidth of the transparent wire is 3 um-500 um.

19. The touch device as claimed in claim 17, wherein a gauge factor of the transparent wire is greater than 0.5.

20. The touch device as claimed in claim 14, wherein:
the pressure-sensing layer comprises a plurality of radial pressure-sensing electrodes,
each of the plurality of radial pressure-sensing electrodes is formed of a plurality of radial patterns bent and rounded by at least one transparent wire, and
at least two of the plurality of radial patterns are formed of one bent and rounded transparent wire.

\* \* \* \* \*